United States Patent
Chae et al.

(10) Patent No.: US 8,055,986 B2
(45) Date of Patent: Nov. 8, 2011

(54) VITERBI DECODER AND METHOD THEREOF

(75) Inventors: Su-Chang Chae, Daejeon (KR); Youn-Ok Park, Daejeon (KR)

(73) Assignees: Samsung Electronics Co., Ltd (KR); Electronics and Telecommunications Research Institute (KR); KT Corporation (KR); SK Telecom Co., Ltd (KR); Hanaro Telecom., Inc (KR)

( * ) Notice: Subject to any disclaimer, the term of this patent is extended or adjusted under 35 U.S.C. 154(b) by 933 days.

(21) Appl. No.: 12/064,175

(22) PCT Filed: Dec. 5, 2005

(86) PCT No.: PCT/KR2005/004111
§ 371 (c)(1), (2), (4) Date: Feb. 19, 2008

(87) PCT Pub. No.: WO2007/021057
PCT Pub. Date: Feb. 22, 2007

(65) Prior Publication Data
US 2008/0250303 A1   Oct. 9, 2008

(30) Foreign Application Priority Data

Aug. 19, 2005 (KR) .................. 10-2005-0076187
Sep. 15, 2005 (KR) .................. 10-2005-0086281

(51) Int. Cl.
*H03M 13/03* (2006.01)
(52) U.S. Cl. .................. 714/795; 714/796; 375/341
(58) Field of Classification Search .................. 714/792, 714/795, 796; 375/265, 341
See application file for complete search history.

(56) References Cited

U.S. PATENT DOCUMENTS

| 5,259,742 | A   |   | 11/1993 | Ichikawa et al. |
|-----------|-----|---|---------|-----------------|
| 5,291,524 | A   | * | 3/1994  | Itakura et al. .................. 375/341 |
| 5,369,671 | A   |   | 11/1994 | Yehushua et al. |
| 6,088,405 | A   | * | 7/2000  | Hladik et al. .................. 375/341 |
| 6,452,985 | B1  |   | 9/2002  | Hatakeyama et al. |
| 6,683,914 | B1  | * | 1/2004  | Mantelet et al. .................. 375/262 |
| 6,877,132 | B1  | * | 4/2005  | De et al. .................. 714/795 |
| 7,765,459 | B2  | * | 7/2010  | Chae et al. .................. 714/795 |

FOREIGN PATENT DOCUMENTS

| EP | 0 409 205 A2 | 7/1990 |
|----|--------------|--------|
| KR | 1992-0021286 | 12/1992 |
| KR | 1993-0011454 | 6/1993 |
| KR | 1999-0077972 | 10/1999 |
| KR | 1020040050754 A | 6/2004 |

OTHER PUBLICATIONS

Wang et al., To Bite or Not to Bite—A Study of Tail Bits versus Tail-Biting, 1996 IEEE.

* cited by examiner

*Primary Examiner* — Yolanda L Wilson
(74) *Attorney, Agent, or Firm* — The Farrell Law Firm, P.C.

(57) ABSTRACT

The present invention relates to a decoder for tail-biting convolution codes and a method thereof. The decoder receives an encoding bit sequence in a convolutional encoding method from a channel, generates an expanded encoding bit sequence, Viterbi decodes the expanded encoding bit sequence, and generates decoded data. In addition, the decoder selects a central bit sequence of the decoded data, rearranges the central bit sequence, and generates final decoded data. Accordingly, the decoder has a simplified configuration for decoding the bit sequence encoded in the tail biting convolutional encoding method, and the decoder also decodes a bit sequence encoded in a zero-tail convolutional encoding method.

14 Claims, 20 Drawing Sheets

[Fig. 1]
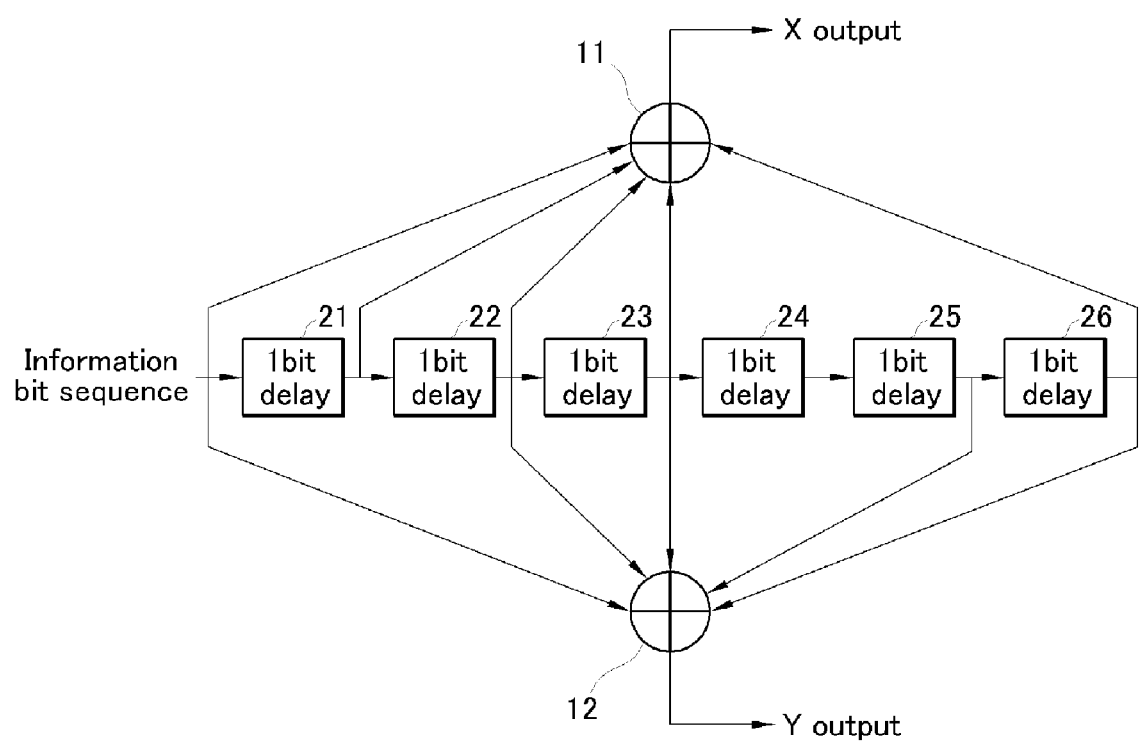

[Fig. 2]
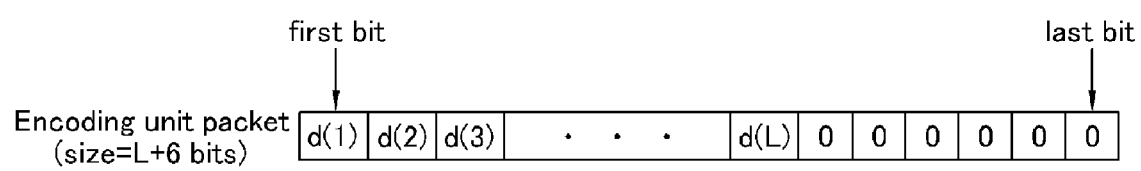

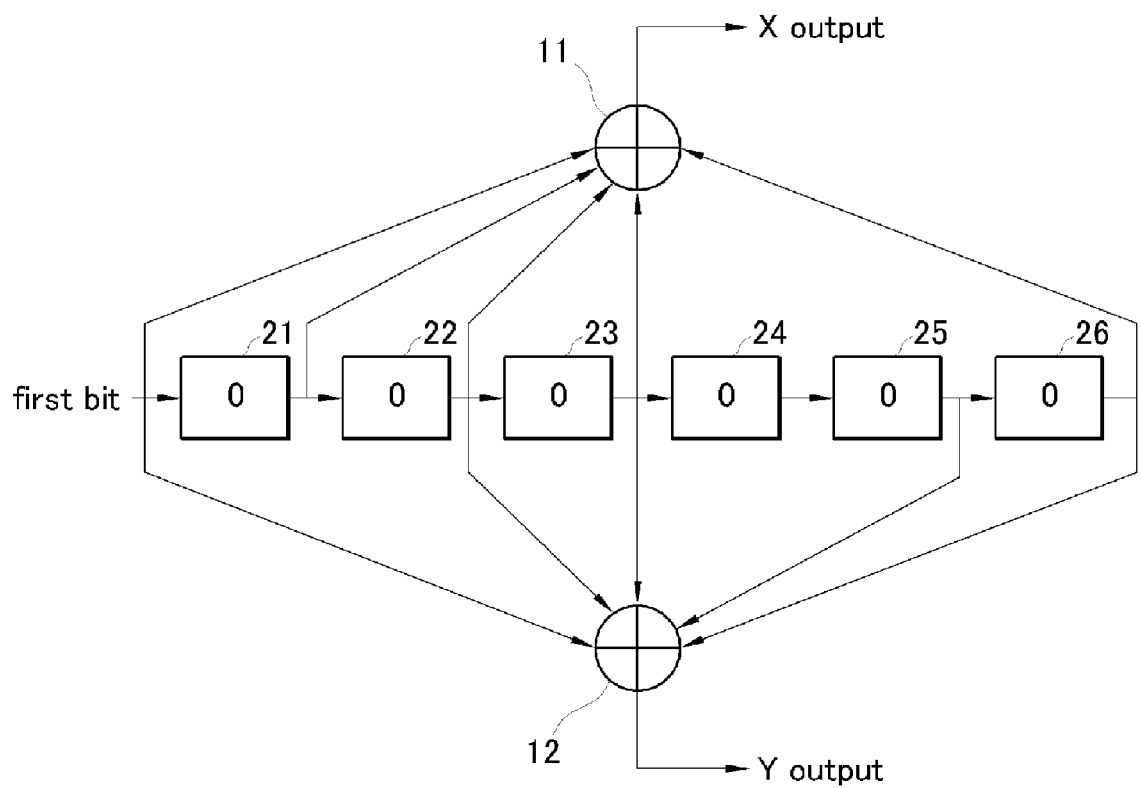
[Fig. 3]

[Fig. 4]
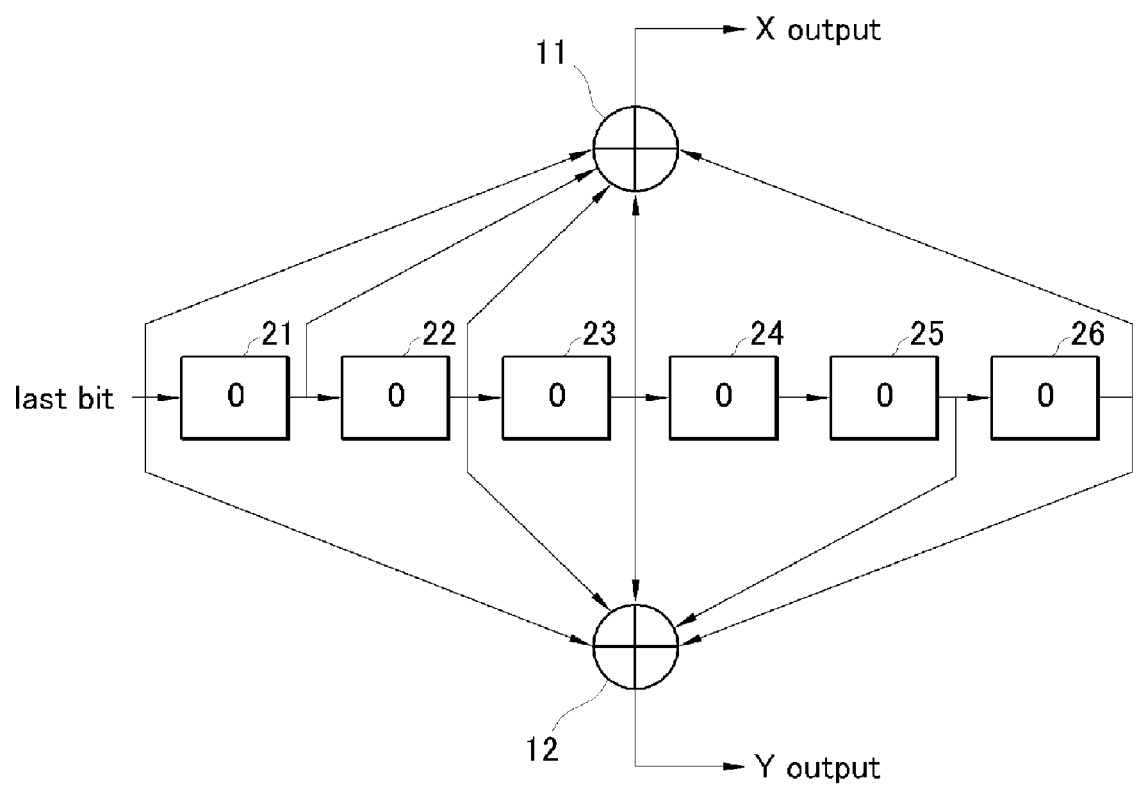

[Fig. 5]
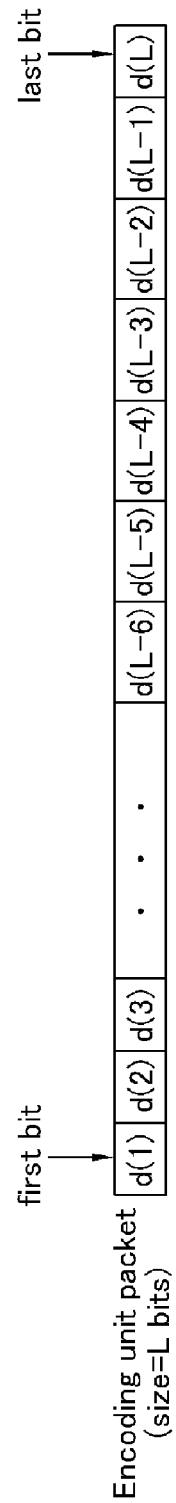

[Fig. 6]
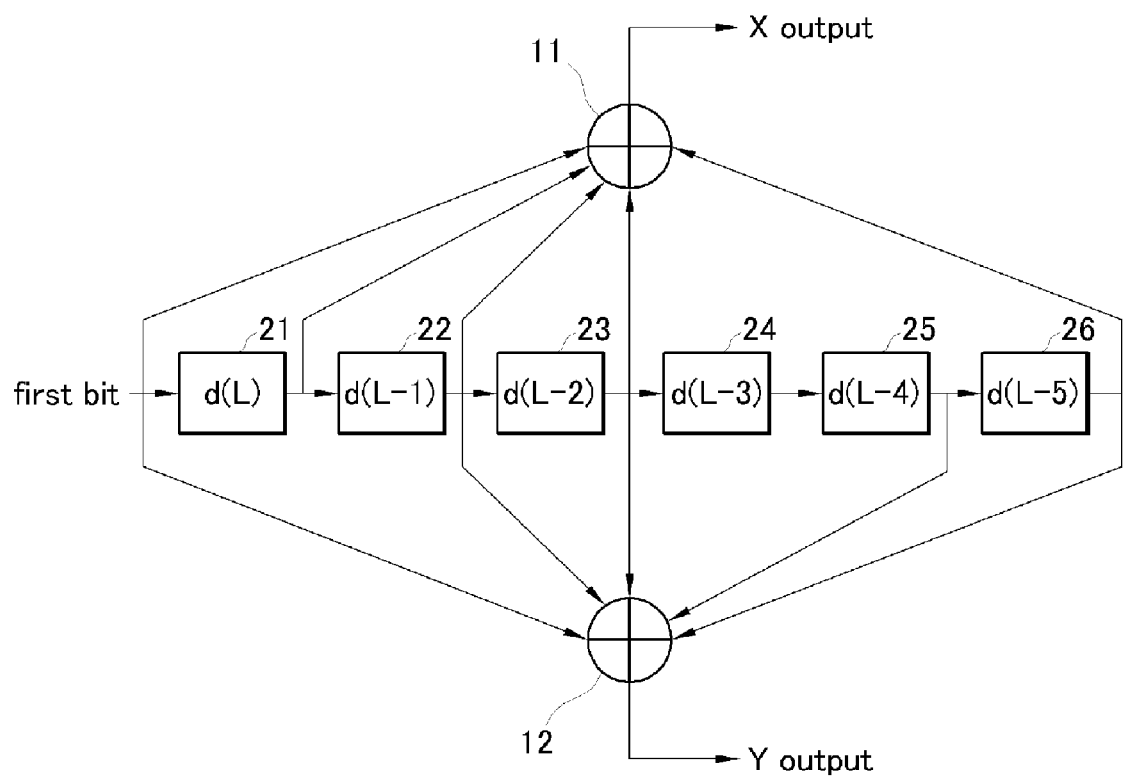

[Fig. 7]
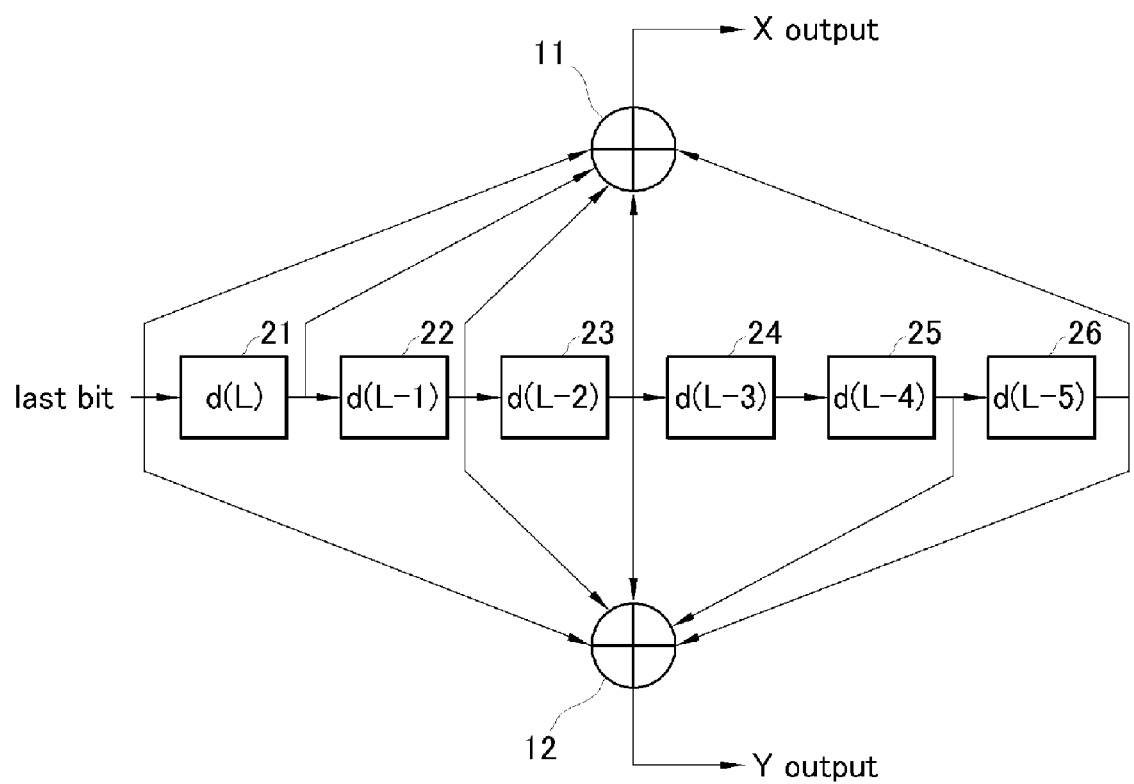

[Fig. 8]
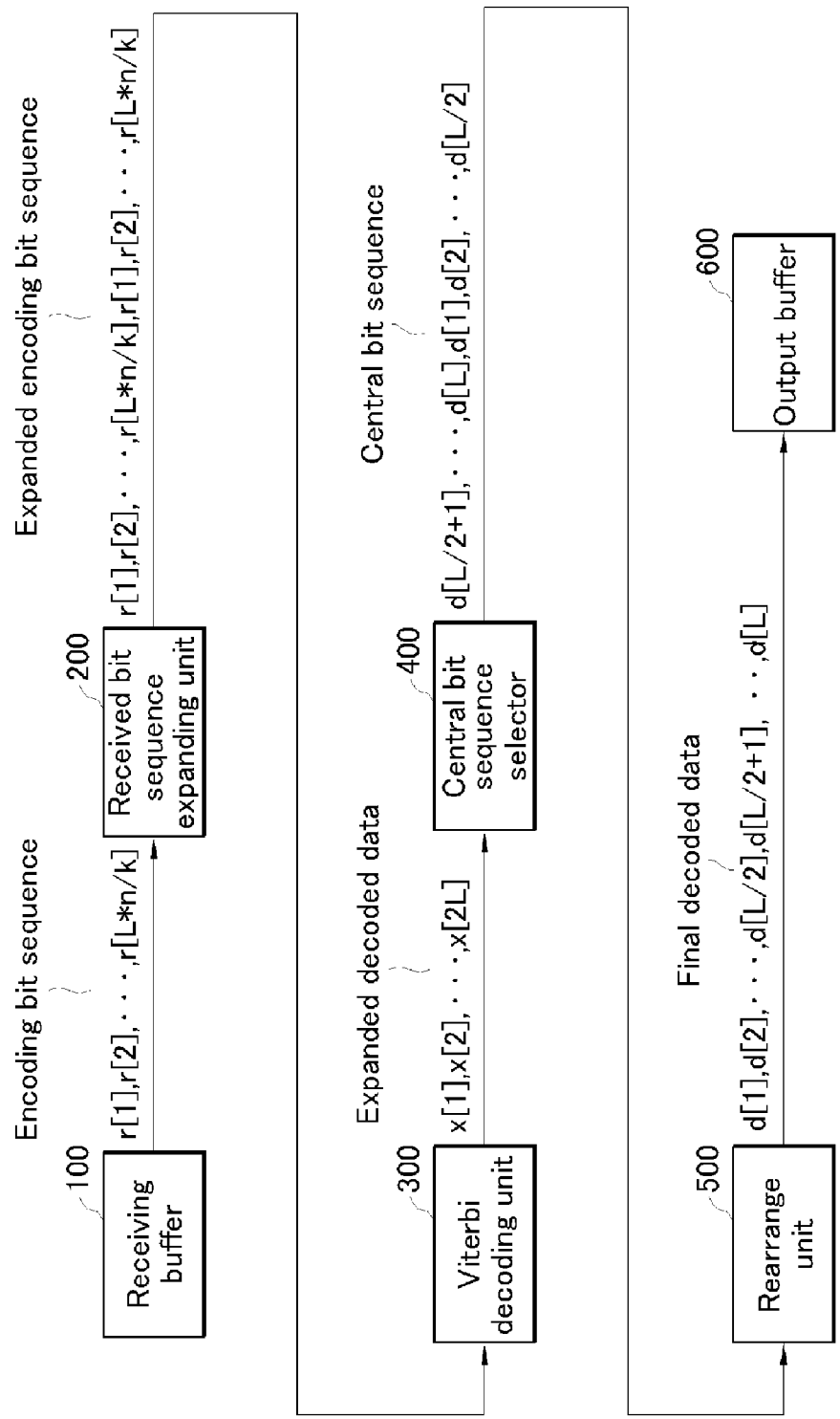

[Fig. 9]
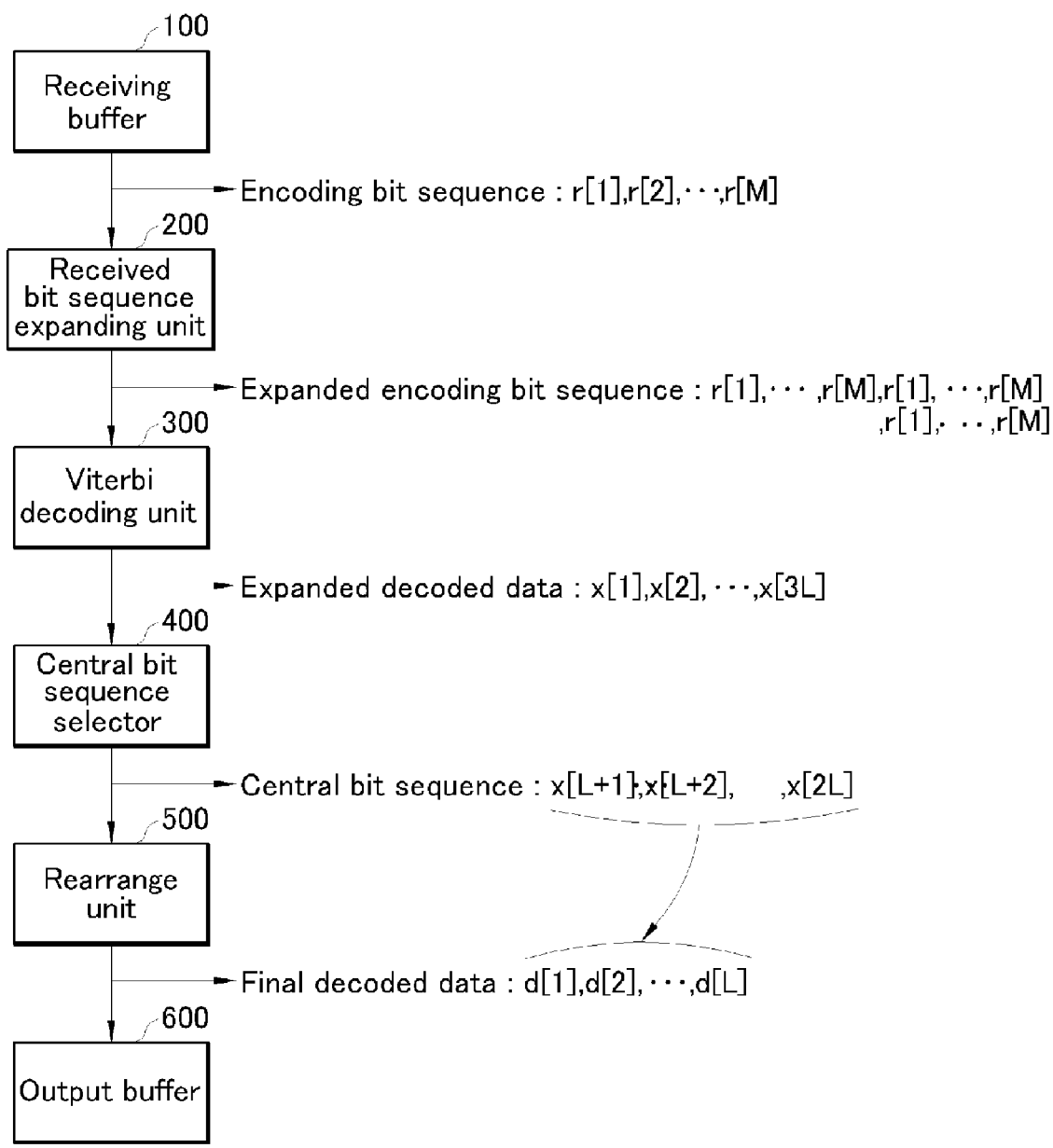

[Fig. 10]
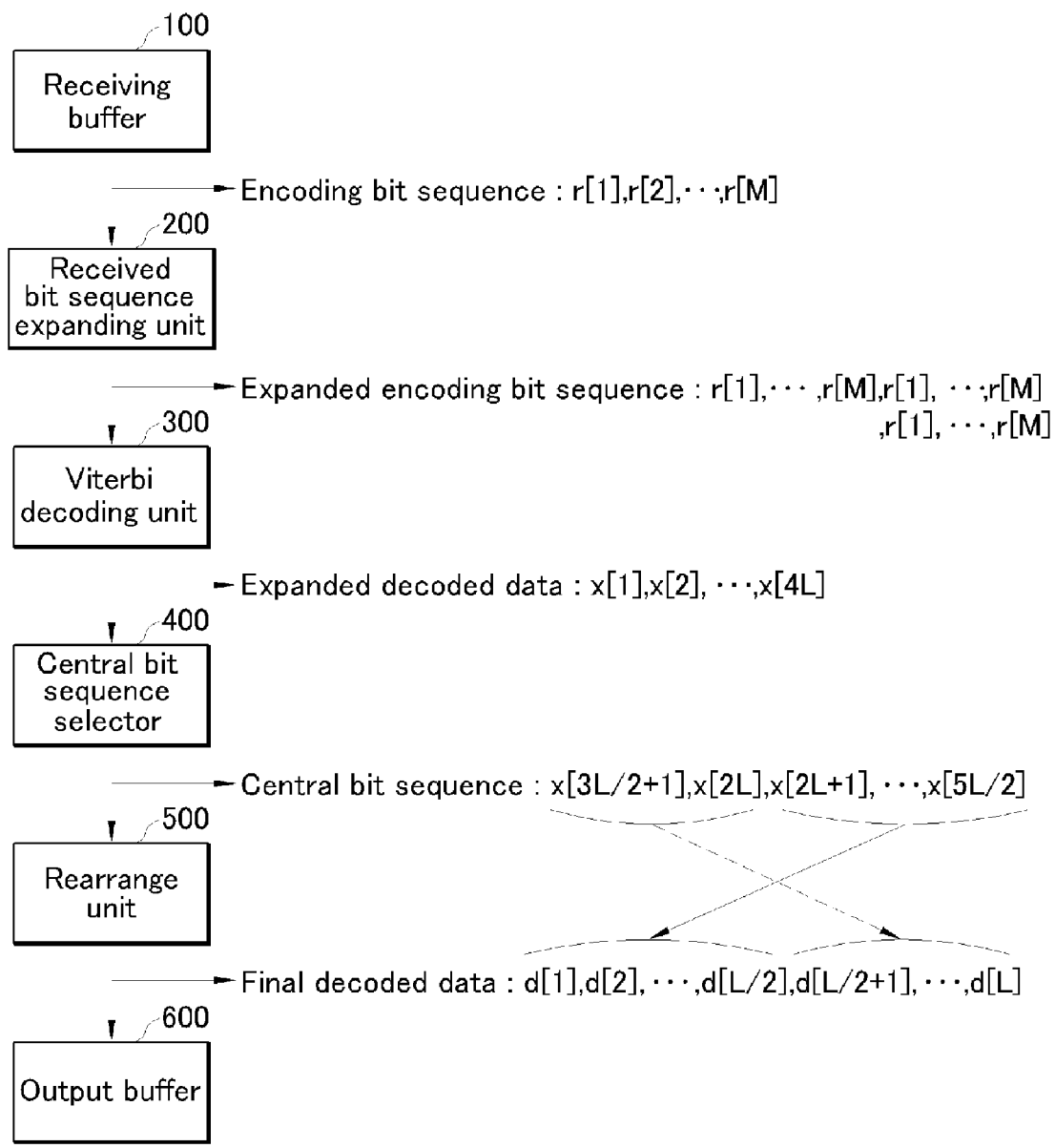

[Fig. 11]
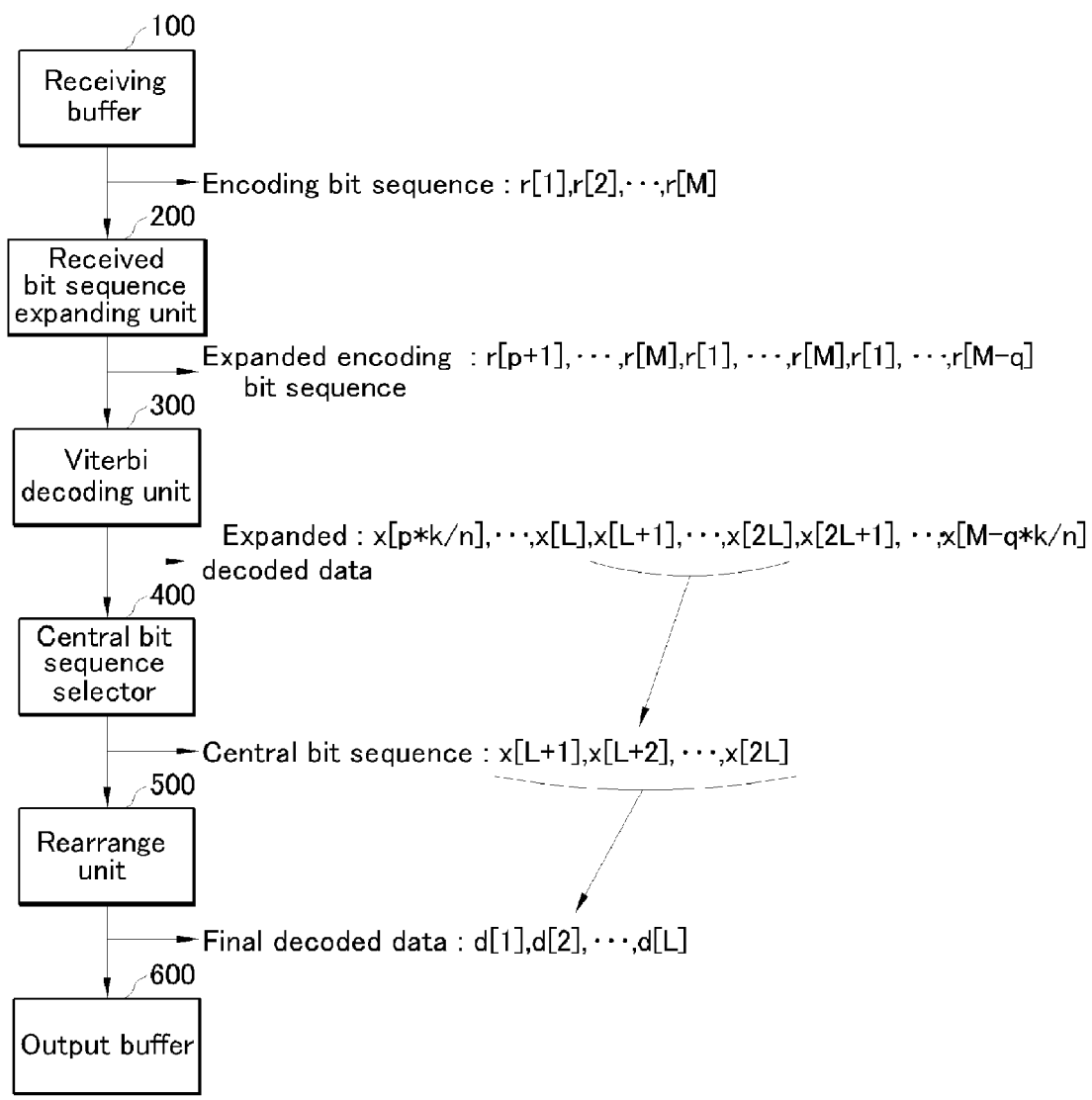

[Fig. 12]
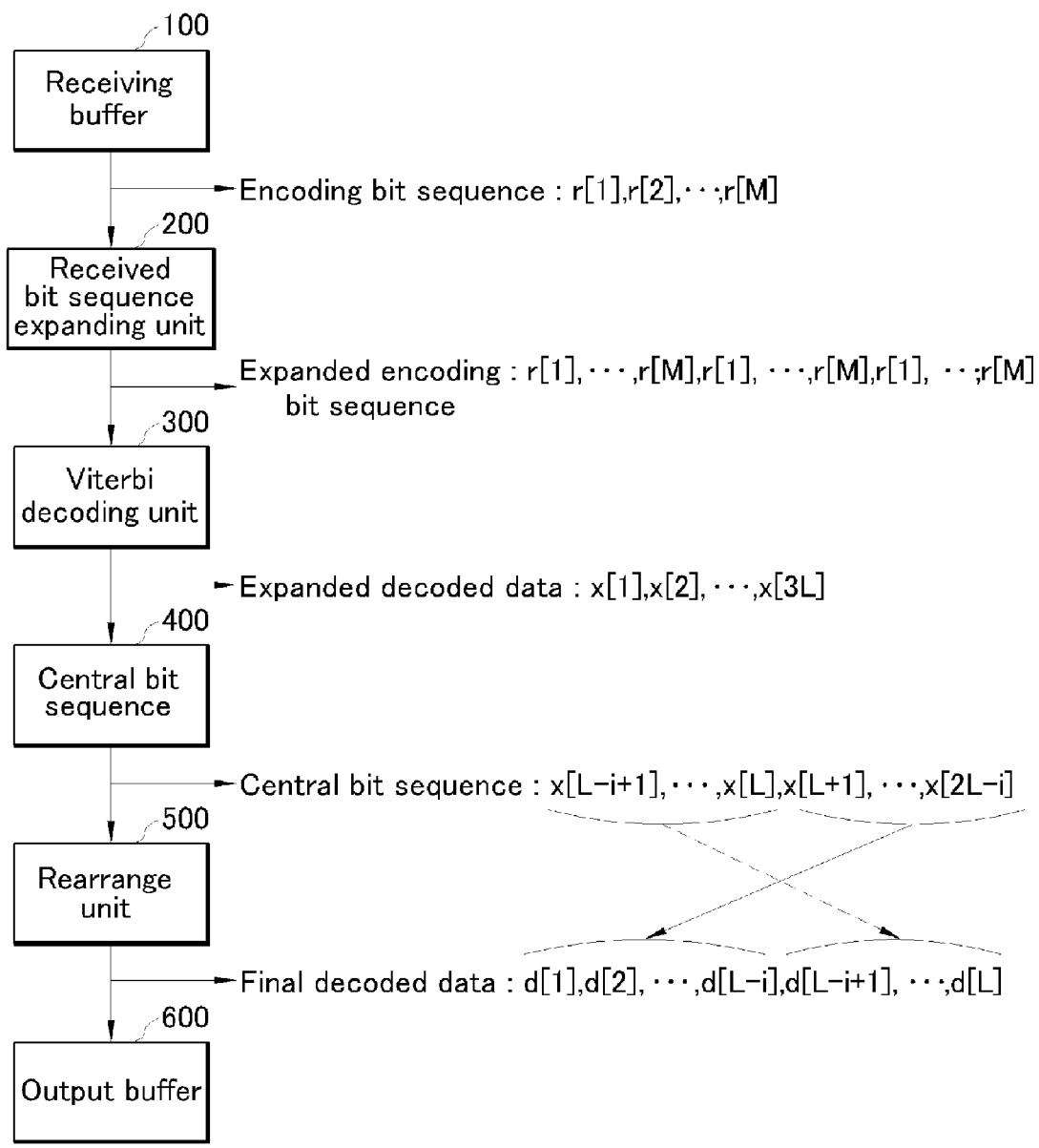

[Fig. 13]
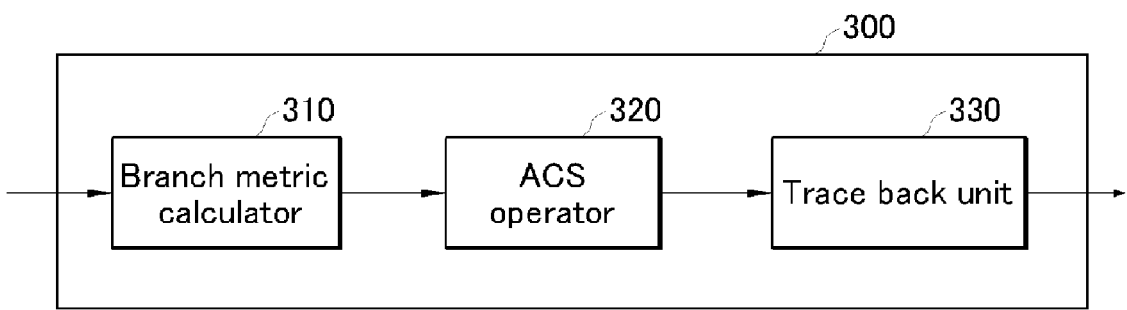

[Fig. 14]
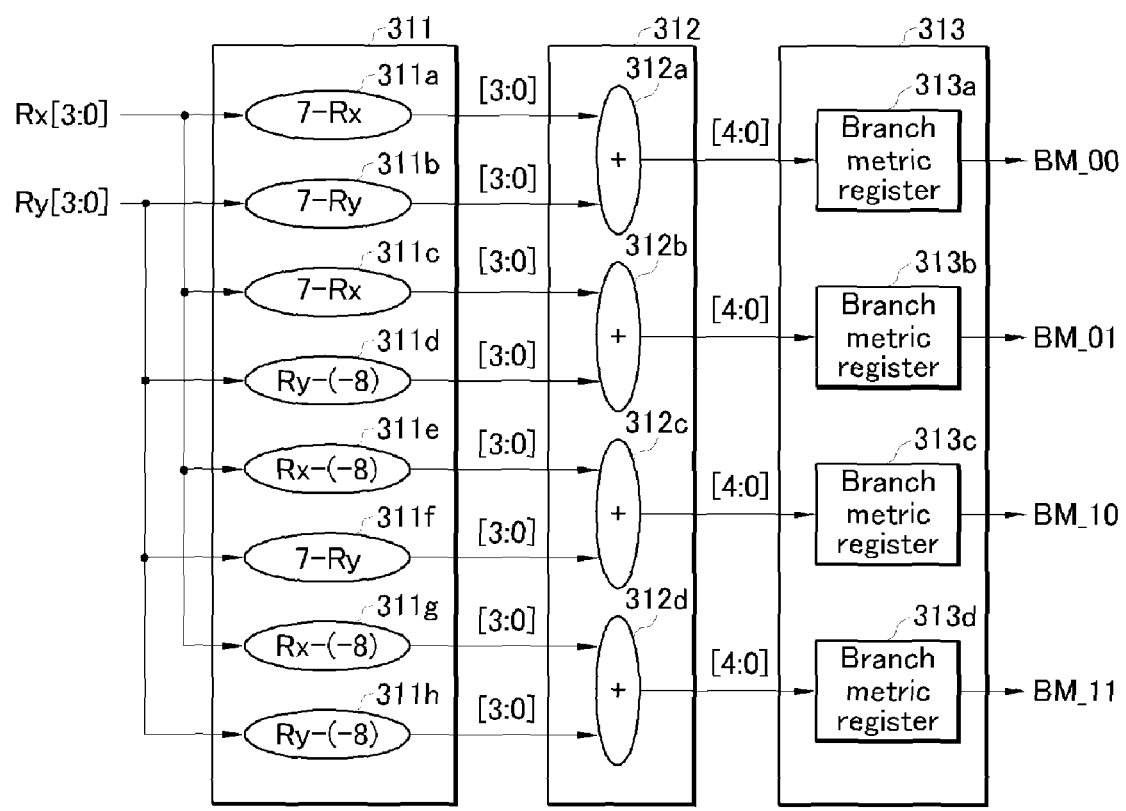

[Fig. 15]
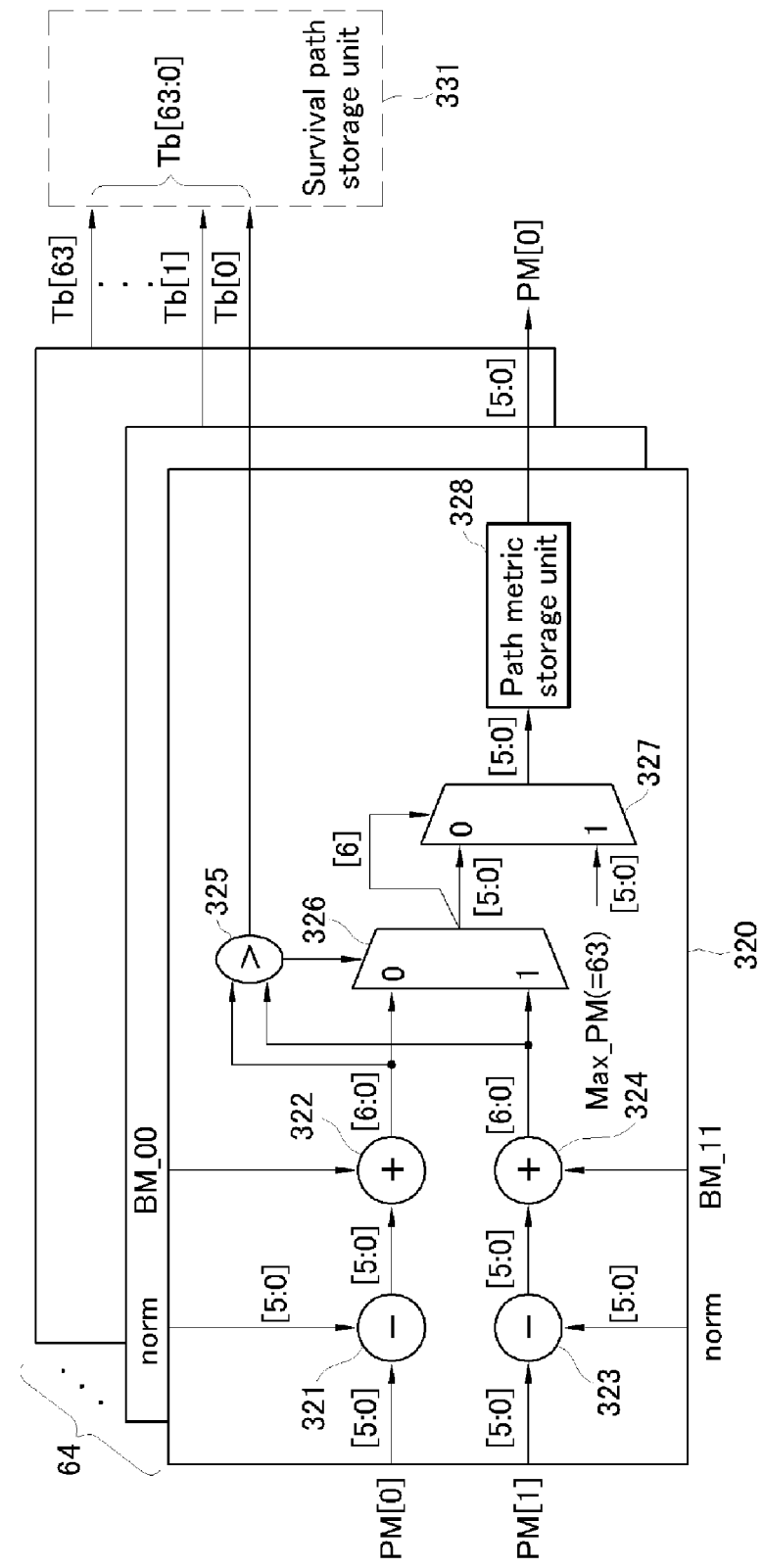

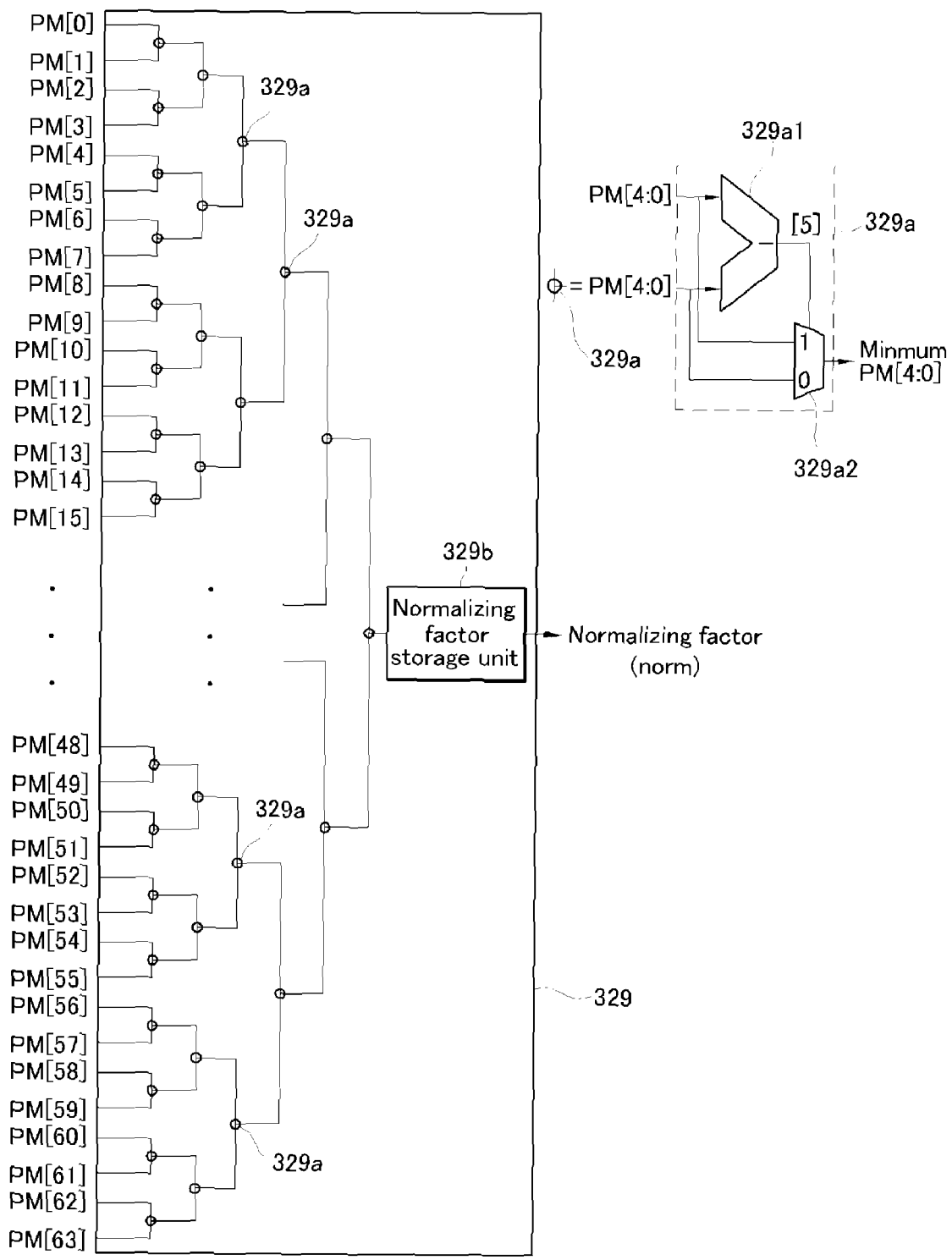
[Fig. 16]

[Fig. 17]
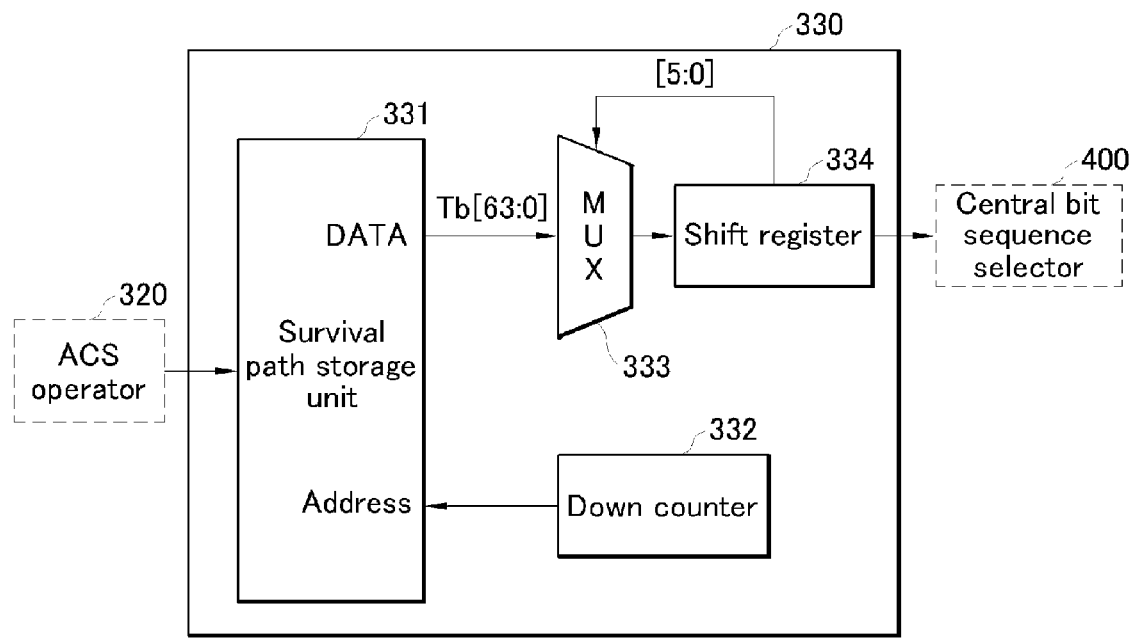

[Fig. 18]
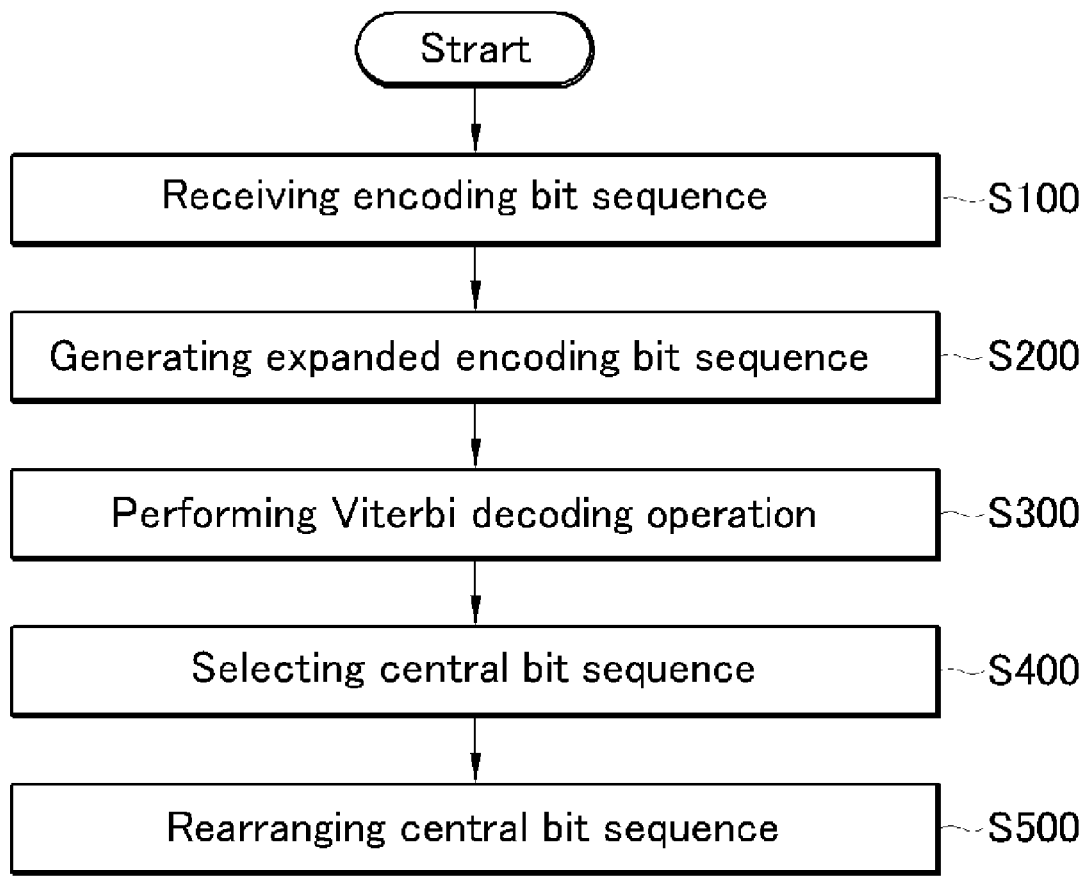

[Fig. 19]
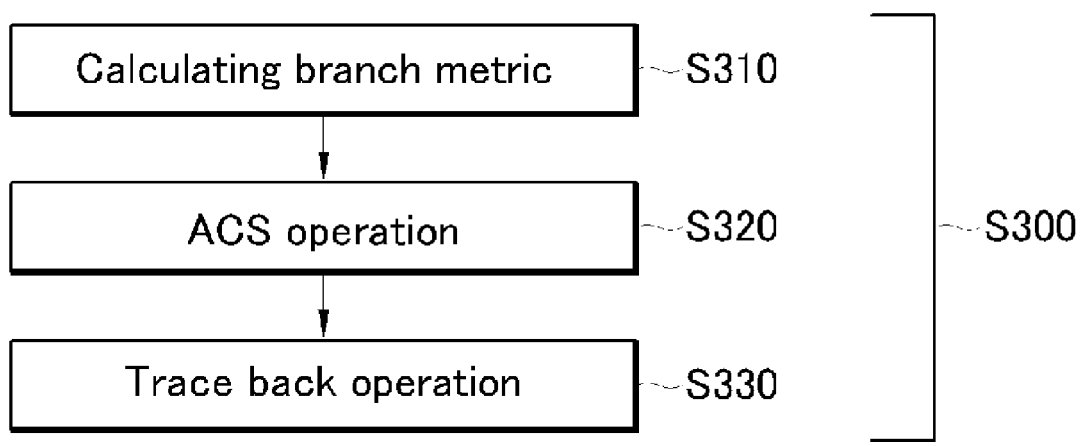

[Fig. 20]
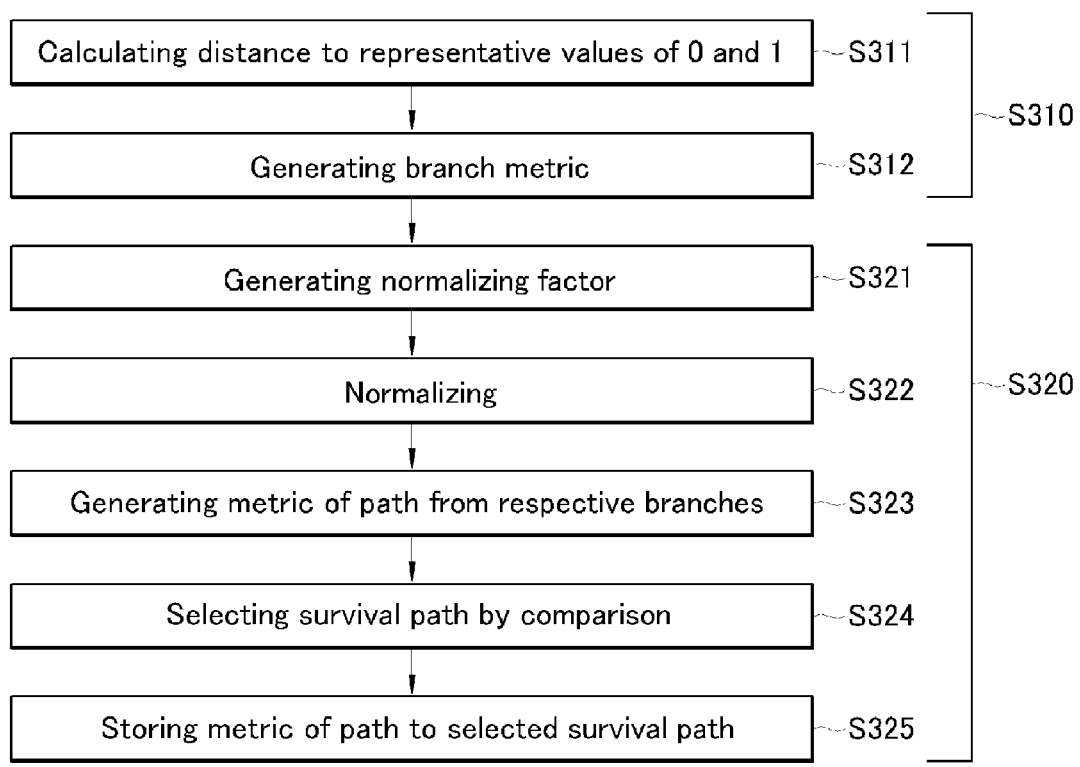

VITERBI DECODER AND METHOD THEREOF

TECHNICAL FIELD

The present invention relates to a Viterbi decoder and a method thereof, and more specifically, to a decoder for tail-biting convolution codes and a method thereof.

BACKGROUND ART

Various digital communication standards have adopted a convolutional coding method for a forward error correction (FCE).

An information bit sequence encoded in the convolutional coding method is decoded by a Viterbi decoder in a receiver.

FIG. 1 shows a diagram of a configuration of a convolutional encoder having a constraint length K of 7 according to the international standard IEEE 802.16.

As shown in FIG. 1, the convolutional encoder having the constraint length K of 7 according the international standard IEEE 802.16 includes two XOR operators 11 and 12 and six delay units 21 to 26. The convolutional encoder receives one bit among the information bit sequence for every clock signal through a first delay unit 21, and generates two encoded symbols by the two XOR operators 11 and 12. The convolutional code is classified as a zero-tail convolutional code and a tail-biting convolutional code.

The zero-tail convolutional encoding method will now be described with reference to FIG. 2 to FIG. 4.

FIG. 2 shows a diagram for representing an encoding unit packet of an encoder in the zero-tail convolutional encoding method.

As shown in FIG. 2, the encoding unit packet of the encoder in the zero-tail convolutional encoding method is formed by adding a sequence of (K−1) zero-bits (a zero-tail sequence) to the information bit sequence. Therefore, when the number of the information bits is L, the number of bits of the encoding unit packet of the encoder in the zero-tail convolutional encoding method is L+K−1. Since the constraint length K is 7 in an exemplary embodiment of the present invention, the encoding unit packet includes L+6 bits.

FIG. 3 shows a diagram for representing an initial state of the encoder in the zero-tail convolutional encoding method. As shown in FIG. 3, each delay unit has a value of 0 when the encoder in the zero-tail convolutional encoding method is at the initial state. Therefore, a Viterbi decoder in the zero-tail convolutional encoding method may start a decoding operation from the 0 state.

FIG. 4 shows a diagram for representing an ending state of the encoder in the zero-tail convolutional encoding method. As shown in FIG. 4, the ending state of the encoder in the zero-tail convolutional encoding method is the 0 state in which each delay unit has the value of 0. Since 0 values of the last K−1 bits of the encoding unit packet are inputted to the convolutional encoder, the ending state of the encoder in the zero-tail convolutional encoding method is becomes the 0 state. Therefore, the Viterbi decoder in the zero-tail convolutional encoding method may start a trace back operation from the 0 state.

Since the additional zero tail sequence having the values of 0 is used in the zero-tail convolutional encoding method, an error may be easily corrected when a last part of the information bit sequence has the error. In addition, the Viterbi decoder may start the decoding and trace back operations from the 0 state since both the initial and ending states of the convolutional encoder are 0, and therefore a configuration of the Viterbi decoder may be simplified. However, there is a problem in that the data rate is reduced due to the additional zero tail sequence in the zero-tail convolutional encoding method. To solve the problem, the tail biting convolutional encoding method has been suggested.

The tail biting convolutional encoding method will now be described with reference to FIG. 5 to FIG. 7.

FIG. 5 shows a diagram for representing an encoding unit packet of an encoder in the tail biting convolutional encoding method. As shown in FIG. 5, the encoding unit packet of the encoder in the tail biting convolutional encoding method has no additional data. Therefore, the data rate in the tail biting convolutional encoding method is better than that in the zero-tail convolutional encoding method.

FIG. 6 shows a diagram for representing an initial state of the encoder in the tail biting convolutional encoding method. As shown in FIG. 6, the initial state of the encoder in the tail biting convolutional encoding method is determined by the last 6 bits of the encoding unit packet. Since the last 6 bits of the encoding unit packet of the encoder in the tail biting convolutional encoding method are respectively not 0, the initial state of the encoder in the tail biting convolutional encoding method is not 0. The encoder in the tail biting convolutional encoding method preferentially receives the last 6 bits of the encoding unit packet before performing an encoding operation, so as to establish the initial state of the encoder as the last 6 bits of the decoding unit packet. At this time, the encoder in the tail biting convolutional encoding method does not generate an encoded output bit. Then, the encoder in the tail biting convolutional encoding method sequentially receives the information bit sequence, and generates the encoded output bit.

FIG. 7 shows a diagram for representing the ending state of the encoder in the tail biting convolutional encoding method. As shown in FIG. 7, differing from the zero-tail convolutional encoding method, the ending state in the tail biting convolutional encoding method is determined by the last 6 bits of the information bit sequence since the ending state includes no additional zero-bit. Therefore, the initial and ending states of the encoder in the tail biting convolutional encoding method are the same.

In addition, the initial and ending states of the encoder in the tail biting convolutional encoding method are not 0 since those are determined by the last 6 bits of the encoding unit packet. Therefore, the Viterbi decoder in the tail biting convolutional encoding method has a problem of determining the initial state for the decoding and trace back back operations, and therefore the configuration of the Viterbi decoder is problematically complicated. In addition, the initial state for the trace back operation may be falsely determined and the final decoded information bit sequence may include an error when the last part of the encoding unit packet has errors.

The above information disclosed in this Background section is only for enhancement of understanding of the background of the invention and therefore it may contain information that does not form the prior art that is already known in this country to a person of ordinary skill in the art.

DISCLOSURE OF INVENTION

Technical Problem

The present invention has been made in an effort to provide a simplified Viterbi decoder of a tail biting convolutional encoding scheme and a method thereof.

Technical Solution

An exemplary Viterbi decoder according to an embodiment of the present invention includes a receiving buffer, a received bit sequence expanding unit, a Viterbi decoding unit, a central bit sequence selector, and a rearrange unit. The receiving buffer receives an encoding bit sequence in a convolutional encoding method from a channel. The received bit sequence expanding unit receives the encoding bit sequence corresponding to an encoding unit from the receiving buffer, and generates an expanded encoding bit sequence by expanding the encoding bit sequence more than twice (some of the initial bit sequence or the last bit sequence of the expanded encoding bit sequence may be omitted). The Viterbi decoding unit receives the expanded encoding bit sequence, Viterbi decodes the expanded bit sequence, and outputs decoded data. The central bit sequence selector selects a central bit sequence of the decoded data, and outputs the central bit sequence. The rearrange unit rearranges an order of the central bit sequence, and generates final decoded data.

The Viterbi decoding unit may include a branch metric calculator, an ACS operator, and a trace back unit. The branch metric calculator calculates branch metrics of branches by differences between the expanded encoding bit sequence and encodes bits on a trellis of a transmitter convolutional encoder. The ACS operator adds the branch metrics to previous state path metrics, calculates metrics of paths from the respective branches to a current state, and selects a survival path for a path having a minimum path metric. The trace back unit traces back the survival path, and outputs decoded data.

In addition, the ACS operator may include a path metric adder, a path metric comparator, a path metric selector, and a path metric storage unit. The path metric adder adds the previous state path metrics to branch metrics of branches from the previous state to the current state, and generates the metrics of paths from the respective branches to the current state. The path metric comparator compares the metrics of paths generated by the path metric adder, and selects the survival path having the minimum path metric. The path metric selector selects a path metric corresponding to the survival path and outputs the selected path metric. The path metric storage unit stores the selected path metric.

In an exemplary decoding method according to another embodiment of the present invention, a) an encoding bit sequence in a convolutional encoding method is received from a channel, b) an expanded encoding bit sequence for an encoding unit based on the encoding bit sequence (the expanded encoding bit sequence is generated by expanding the encoding bit sequence more than twice, and some of the initial bit sequence and the last bit sequence of the expanded encoding bit sequence may be omitted) is generated, c) the expanded encoding bit sequence is Viterbi decoded and decoded data are outputted, d) a central bit sequence of the decoded data is selected, and e) an order of the central bit sequence is rearranged and final decoded data are generated.

Advantageous Effects

According to the exemplary embodiment of the present invention, a bit sequence encoded in the tail biting convolutional encoding method may be decoded by a simple decoding device.

In addition, according to the exemplary embodiment of the present invention, bit sequences respectively encoded in the tail biting convolutional encoding method and the zero-tail convolutional encoding method may be decoded by one decoding device.

BRIEF DESCRIPTION OF THE DRAWINGS

FIG. 1 shows a diagram of a configuration of a convolutional encoder having a constraint length K of 7 according an international standard IEEE 802.16.

FIG. 2 shows a diagram for representing an encoding unit packet of an encoder in a zero-tail convolutional encoding method.

FIG. 3 shows a diagram for representing an initial state of the encoder in the zero-tail convolutional encoding method.

FIG. 4 shows a diagram for representing an ending state of the encoder in the zero-tail convolutional encoding method.

FIG. 5 shows a diagram for representing an encoding unit packet of an encoder in a tail biting convolutional encoding method.

FIG. 6 shows a diagram for representing an initial state of the encoder in the tail biting convolutional encoding method.

FIG. 7 shows a diagram for representing the ending state of the encoder in the tail biting convolutional encoding method.

FIG. 8 shows a diagram of a configuration of a Viterbi decoder according to a first exemplary embodiment of the present invention.

FIG. 9 shows a diagram for representing the Viterbi decoder according to a second exemplary embodiment of the present invention.

FIG. 10 shows a diagram for representing the Viterbi decoder according to a third exemplary embodiment of the present invention.

FIG. 11 shows a diagram for representing the Viterbi decoder according to a fourth exemplary embodiment of the present invention.

FIG. 12 shows a diagram for representing the Viterbi decoder according to a fifth exemplary embodiment of the present invention.

FIG. 13 shows a block diagram for representing a Viterbi decoding unit according to the exemplary embodiment of the present invention.

FIG. 14 shows a diagram for representing a branch metric calculator according to the exemplary embodiment of the present invention.

FIG. 15 shows a diagram for representing an ACS operator according to the exemplary embodiment of the present invention.

FIG. 16 shows a normalizing factor generator 329 according to the exemplary embodiment of the present invention.

FIG. 17 shows a diagram for representing a trace back unit according to the exemplary embodiment of the present invention.

FIG. 18 shows a flowchart for representing the decoding method according to the exemplary embodiment of the present invention.

FIG. 19 shows a flowchart for representing the Viterbi decoding method according to the exemplary embodiment of the present invention.

FIG. 20 shows a flowchart for representing steps for generating the branch metrics and ACS operation steps according to the exemplary embodiment of the present invention.

BEST MODE FOR CARRYING OUT THE INVENTION

An exemplary embodiment of the present invention will hereinafter be described in detail with reference to the accompanying drawings.

In the following detailed description, only certain exemplary embodiments of the present invention have been shown and described, simply by way of illustration. As those skilled in the art would realize, the described embodiments may be modified in various different ways, all without departing from the spirit or scope of the present invention. In addition, the drawings and description are to be regarded as illustrative in nature and not restrictive, and like reference numerals designate like elements throughout the specification.

Throughout this specification and the claims which follow, unless explicitly described to the contrary, the word "comprise" or variations such as "comprises" or "comprising" will be understood to imply the inclusion of stated elements but not the exclusion of any other elements.

While a transmitter uses a convolution encoder having a constraint length K of 7 according to the IEEE802.16 international standard in an exemplary embodiment of the present invention, it is to be understood that the present invention covers various convolutional encoders.

In the exemplary embodiment of the present invention, the convolutional encoder uses a tail biting convolutional encoding method.

In addition, L denotes an encoding unit size of the convolutional encoder. At this time, when a code rate of the convolutional encoder is k/n, an encoded output bit sequence of the convolutional encoder will be L*n/k (hereinafter, L*n/k will also be referred to as M). When the constraint length of the convolutional encoder is 7 according to the IEEE802.16, the encoded output bit sequence of the convolutional encoder will be 2L. Hereinafter, a length of the encoded output bit sequence will be referred to as L*n/k in the exemplary embodiment of the present invention.

A Viterbi decoder according to the exemplary embodiment of the present invention will now be described with reference to FIG. 8 to FIG. 12.

FIG. 8 shows a diagram of a configuration of the Viterbi decoder according to a first exemplary embodiment of the present invention.

As shown in FIG. 8, the Viterbi decoder according to the exemplary embodiment of the present invention includes a receiving buffer 100, a received bit sequence expanding unit 200, a Viterbi decoding unit 300, a central bit sequence selector 400, a rearrange unit 500, and an output buffer 600.

The receiving buffer 100 receives an encoding bit sequence of the tail biting convolutional encoding method through a channel.

The received bit sequence expanding unit 200 receives a sequence of L*n/k encoding bits corresponding to the encoding unit L of the convolutional encoder from the receiving buffer 100. In addition, the received bit sequence expanding unit 200 generates an expanded encoding bit sequence based on the received encoding bit sequence. As shown in FIG. 8, the expanded encoding bit sequence according to the first exemplary embodiment of the present invention is a signal generated by outputting the encoding bit sequence twice.

The Viterbi decoding unit 300 decodes the expanded encoding bit sequence according to the Viterbi decoding method. The Viterbi decoding unit 300 outputs 2L expanded decoded data since the Viterbi decoding unit 300 receives the sequence of 2*L*n/k encoding bits. In addition, the Viterbi decoding unit 300 may use various Viterbi decoding methods including a Radix-2 method and a Radix-4 method.

The central bit sequence selector 400 selects a sequence of L central bits d[L/2+1], . . . , d[L], d[1], . . . , and d[L/2] among the 2L expanded decoded datadecoded generated by the Viterbi decoding unit 300, and outputs the selected sequence. While the central bit sequence selector 400 selects the sequence of the exactly central bits to output the selected sequence in the exemplary embodiment of the present invention, it may select a bit sequence that is moved from the center a little as errors may not occur. An operation of the Viterbi decoding unit 300 is divided as a decoding operation and a trace back operation, and initial states of the decoding and trace back operations may not be easily obtained in the tail biting convolutional encoding method. It is quite probable that the initial L/2 bits d[1], . . . , and d[L/2] of the decoded datadecoded may have an error since the initial state of the decoding operation differs from the initial state of the convolutional encoder according to characteristics of the tail biting convolutional encoding method, when an Viterbi operation according to the exemplary embodiment of the present invention is performed. Therefore, the central bit sequence selector 400 does not output the initial L/2 bits of the decoded datadecoded. It is also probable that the last L/2 bits d[L/2+1], . . . , d[L]) of the decoded datadecoded may have an error since the initial state of the trace back operation differs from the ending state of the convolutional encoder according to characteristics of the tail biting convolutional encoding method, when the decoding operation according to the exemplary embodiment of the present invention is performed. Therefore, the central bit sequence selector 400 does not output the L/2 last bits of the decoded datadecoded.

The rearrange unit 500 rearranges the sequence of the central bits selected by the central bit sequence selector 400 and outputs final decoded datadecoded. That is, the rearrange unit 500 outputs a sequence of former half bits d[L/2+1], . . . , and d[L] of the central bit sequence after outputting a sequence of the latter half bits d[L/2+1], . . . , and d[L] thereof. Accordingly, the sequence of latter half bits d[L/2+1], . . . , and d[L] of the central bit sequence is to be a sequence of former half bits d[1], . . . , and d[L/2] of the final decoded datadecoded.

The output buffer 600 stores the final decoded datadecoded and output the stored final decoded datadecoded in 8 bits or 16 bits according to the conditions.

FIG. 9 shows a diagram for representing the Viterbi decoder according to a second exemplary embodiment of the present invention.

As shown in FIG. 9, the received bit sequence expanding unit 200 of the Viterbi decoder according to the second exemplary embodiment of the present invention generates the expanded encoding bit sequence by outputting the received encoding bit sequence three times.

The Viterbi decoding unit 300 receiving the three-times expanded encoding bit sequence generates expanded decoded datadecoded which is three times longer than the length L of the original information bit.

At this time, since it is quit probable that the expanded former half and latter half bit sequences of the expanded decoded datadecoded may have an error due to the decoding and trace back operations at an arbitrary state, the central bit sequence selector 400 selects a sequence of central bits of the expanded decoded datadecoded and outputs the selected sequence.

As shown in FIG. 9, since the central bit sequence selector 400 according to the second exemplary embodiment of the present invention selects the sequence of the exactly central bits, the rearrange unit 500 may bypass the received central bit sequence.

FIG. 10 shows a diagram for representing the Viterbi decoder according to a third exemplary embodiment of the present invention.

As shown in FIG. 10, the received bit sequence expanding unit 200 of the Viterbi decoder according to the third exemplary embodiment of the present invention may generate the expanded encoding bit sequence by outputting the received encoding bit sequence four times. That is, the received bit sequence expanding unit 200 generates the expanded encoding bit sequence by outputting the received encoding bit sequence more than two times. As the information bit sequence is expanded, the decoding performance may be effectively increased when the length L of the information bit sequence is short.

FIG. 11 shows a diagram for representing the Viterbi decoder according to a fourth exemplary embodiment of the present invention.

As shown in FIG. 11, an initial bit of the expanded encoding bit sequence generated by the received bit sequence expanding unit 200 is not necessarily the initial bit of the received encoding bit sequence, and a last bit of the expanded encoding bit sequence is not necessarily the last bit of the encoding bit sequence.

As shown in FIG. 11, the received bit sequence expanding unit 200 according to the fourth exemplary embodiment of the present invention generates the expanded encoding bit sequence by outputting the received encoding bit sequence three times, and does not output a sequence of first p bits and a sequence of last q bits.

FIG. 12 shows a diagram for representing the Viterbi decoder according to a fifth exemplary embodiment of the present invention.

In the fifth exemplary embodiment of the present invention, the central bit sequence selector 400 is not required to select the sequence of the exact central bits of the expanded encoding data.

As shown in FIG. 12, the Viterbi decoder according to the fifth exemplary embodiment of the present invention selects a bit sequence shifted from the center of the expanded decoded datadecoded to the left by i bits and outputs the selected bit sequence. At this time, the rearrange unit 500 generates the final decoded datadecoded according to the moved central bit sequence.

The Viterbi decoding unit 300 will now be described with reference to FIG. 13.

FIG. 13 shows a block diagram for representing the Viterbi decoding unit 300 according to the exemplary embodiment of the present invention.

As shown in FIG. 13, the Viterbi decoding unit 300 according to the exemplary embodiment of the present invention includes a branch metric calculator 310, an ACS operator 320, and a trace back unit 330.

The branch metric calculator 310 calculates branch metrics on respective branches by differences between the expanded encoding bit sequence received from the received bit sequence expanding unit 200 and encoding bits on a trellis of a transmitter convolutional encoder (the encoding bits on the trellis are also referred to as branch coded word (BCW)).

The ACS operator 320 adds a previous path metric to the branch metric calculated by the branch metric calculator 310 to calculate metrics of paths from the respective branches to a current state. In addition, the ACS operator 320 compares the metrics of paths from the respective branches to find a minimum path metric, and selects a survival path having the minimum path metric.

The trace back unit 330 traces back the trellis of the transmitter convolutional encoder based on the survival path from the ACS operator 320, and generates the expanded encoding data.

The branch metric calculator 310 will now be described with reference to FIG. 14.

FIG. 14 shows a diagram for representing the branch metric calculator 310 according to the exemplary embodiment of the present invention.

The Viterbi decoding unit 300 according to the exemplary embodiment of the present invention has a Radix-2 configuration and uses 4-bit soft decision binary data. The Radix-2 Viterbi decoder generates four branch metrics.

As shown in FIG. 14, the branch metric calculator 310 according to the exemplary embodiment of the present invention includes a distance calculator 311, a branch metric adder 312, and a branch metric storage unit 313.

The distance calculator 311 calculates a distance value between an input value of the Viterbi decoding unit 300 and representative values of 0 and 1. The representative values of 0 and 1 are respectively 7 and 8.

The branch metric adder 312 generates the branch metrics according to a state transition by the distance values generated by the distance calculator 311. Since the Viterbi decoding unit 300 according to the exemplary embodiment of the present invention has the Radix-2 configuration, the branch metric adder 312 generates four branch metrics BM_00, BM_01, BM_10, and BM_11. The respective branch metrics may be presented as 5 bits since they are obtained by adding two 4-bit distance values calculated by the distance calculator 311.

The branch metric storage unit 313 stores the four branch metrics generated by the branch metric adder 312. Then, the branch metrics stored in the branch metric storage unit 313 are used to calculate the path metric.

The ACS operator 320 will now be described with reference to FIG. 15 and FIG. 16.

FIG. 15 shows a diagram for representing the ACS operator 320 according to the exemplary embodiment of the present invention. FIG. 16 shows a normalizing factor generator 329 according to the exemplary embodiment of the present invention.

Since the transmitter according to the exemplary embodiment of the present invention uses the convolutional encoder having the constraint length K of 7, the convolutional encoder has 64 states. Therefore, the ACS operator 320 generates 64 path metrics and survival paths by 64 operation blocks (the 64 operation blocks are shown without reference numerals).

As shown in FIG. 15, the respective blocks of the ACS operator 320 include two normalizing units 321 and 323, two path metric adders 322 and 324, a path metric comparator 325, a path metric selector 326, a path metric clipper 327, and a path metric storage unit 328.

In addition, as shown in FIG. 16, the ACS operator 320 further includes a normalizing factor generator 329.

The normalizing factor generator 329 finds a normalizing factor (norm), a minimum path metric among the previous state path metrics, by a plurality of minimum path metric extractors 329a.

The minimum value extractor 329a according to the exemplary embodiment of the present invention receives the two previous path metrics and output the smaller value of the two. The minimum value extractor 329a according to the exemplary embodiment of the present invention includes a comparator 329a1 and a selector 329a2. The comparator 329a1 receives the two previous state path metrics, performs subtraction of the two values, and outputs an MSB among a result value of the subtraction. When PM0 and PM1 denote the two previous state path metrics and R0 (=PM0−PM1) denotes the resulting value of the comparator 329a1, PM0>PM1 when the MSB of R0 is 0, and PM0<PM1 when the MSB R0 is 1. The selector 329a2 is realized by a 5-bit 2-input multiplexer, and it selects an output value with reference to 1 bit information generated by the comparator 329a1. Accordingly, the minimum value extractor 329a according to the exemplary embodiment of the present invention selects a less value between PM0 and PM1, and outputs the minimum value.

In addition, the normalizing factor generator 329 binds the previous state path metrics in pairs, and compares the respective pairs to find smaller values of the pairs. Then, the normalizing factor generator 329 binds the found smaller values in pairs, and compares the respective pairs to find smaller values of the pairs. Accordingly, the normalizing factor generator 329 finds the norm which is the minimum path metric. The found normalizing factor (norm) is stored in a normalizing factor storage unit 329b.

The operation blocks of the ACS operator 320 receive two path metrics (e.g., PM[0] and PM[1] in FIG. 15) of the previous states (e.g., 0 and 1 states in FIG. 15), and finally selects the minimum path metric among the metrics of paths to the current state. In addition, the respective blocks of the ACS operator 320 generate a survival path (e.g., Tb[0] in FIG. 15) having the minimum path metric.

The two normalizing units 321 and 323 subtract the normalizing factor (norm) by the normalizing factor generator 329 from the two path metrics PM[0] and PM[1]. Accordingly, the path metric may be maintained at a predetermined number of bits (6 bits in the exemplary embodiment of the present invention) as the trellis of the transmitter convolutional encoder proceeds.

The two path metric adders 322 and 324 add branch metrics (e.g., BM_00 and BM_11) of branches, i.e., the branches from the previous state to the current state, to the previous state path metrics PM[0] and PM[1], and generate the metrics of paths from the respective branches to the current state.

The path metric comparator 325 receives the path metrics generated by the path metric adders 322 and 324, performs subtraction of the path metrics, and outputs a 1-bit most significant bit (MSB) thereof. The 1-bit outputted by the path metric comparator 325 is information indicating the result of comparison between the two metrics of paths from the respective branches to the current state, and is information indicating the survival path. The 1-bit outputted by the path metric comparator 325 as the survival path is stored in a survival path storage unit 331 in FIG. 17 of a trace back unit 330, as shown in FIG. 17. The survival path storage unit 331 and the trace back unit 330 will be described later.

The path metric selector 325 receives the 1-bit outputted by the path metric comparator 325, selects a smaller value among the metrics of paths from the respective branches to the current state, and outputs the selected value.

To maintain the selected value to be in 6 bits, the path metric clipper 327 clips the selected value to be $111111_2$ when the inputted value is equal to or greater than $1000000_2$, and outputs the clipped value. Accordingly, the selected value may be maintained in 6 bits.

The metric of the path selected by the path metric selector 325, and clipped and outputted by the path metric clipper 327, is stored in the path metric storage unit 328 to be used for generating a subsequent state path metric.

The trace back unit 330 will now be described with reference to FIG. 17.

FIG. 17 shows a diagram for representing the trace back unit 330 according to the exemplary embodiment of the present invention.

As shown in FIG. 17, the trace back unit 330 according to the exemplary embodiment of the present invention includes a survival path storage unit 331, a down counter 332, a multiplexer 333, and a shift register 334.

The survival paths generated by the path metric comparator 325 of the respective operation blocks of the ACS operator 320 are stored in the survival path storage unit 331. Since the number of the respective operation blocks of the ACS operator 320 is 64, the survival path is 64-bit information.

The down counter 332 reduces a memory address of the survival path storage unit 331 by 1 for each clock signal. Accordingly, the survival path storage unit 331 outputs a 64-bit survival path for each clock signal.

The multiplexer 333 outputs 1 bit corresponding to 6 bits indicated by the shift register 334. The shift register 334 inputs the received 1-bit to a least significant bit (LSB), and transmits a carry generated by shifting the 6-bit register to the central bit sequence selector 400. A set of generated carries becomes the expanded decoded datadecoded.

The Viterbi decoding method according to the exemplary embodiment of the present invention will now be described with reference to FIG. 18 to FIG. 20.

FIG. 18 shows a flowchart for representing the decoding method according to the exemplary embodiment of the present invention, and FIG. 19 shows a flowchart for representing the Viterbi decoding method according to the exemplary embodiment of the present invention. In addition, FIG. 20 shows a flowchart for representing steps for generating the branch metrics and ACS operation steps according to the exemplary embodiment of the present invention.

The receiving buffer 100 receives the encoding bit sequence from a channel in step S100.

The received bit sequence expanding unit 200 receives the encoding bit sequence corresponding to an encoding unit from the receiving buffer 100, and outputs the expanded encoding bit sequence in step S200.

The Viterbi decoding unit 300 receives the expanded encoding bit sequence and Viterbi decodes the received bit sequence in step S300. The Viterbi decoding step S300 includes a branch metric calculating step S310, an ACS operation step S320, and trace back step S330.

In the branch metric calculating step S310, the branch metrics for the respective branches are calculated by using differences between the expanded encoding bit sequence received from the received bit sequence expanding unit 200 and the encoding bits (branch coded word, BCW) on the trellis of the transmitter convolutional encoder. In further detail, the distance calculator 311 calculates the distance value between the input value of the Viterbi decoding unit 300 and the representative values of 0 and 1 in step S311. The branch metric adder 312 generates the branch metrics generated in the state transition by the distance value generated by the distance calculator 311 in step S312.

In the ACS operation step S320, the metrics of paths from the respective branches to the current state are calculated by adding the branch metrics calculated by the branch metric calculator 310 to the previous state path metric, the path metrics at the respective states are updated by finding the minimum path metric among the calculated path metrics, and the survival path having the minimum path metric is selected. In further detail, the normalizing factor generator 329 generates the normalizing factor (norm) for preventing the respective path metrics from being overflowed in step S321. The normalizing factor may be defined by the minimum value among the path metrics at the respective states. The normalizing units 321 and 323 normalize the previous state path metric in step S322 by the normalizing factor (norm) generated by the normalizing factor generator 329. At this time, the normalizing units 321 and 323 may normalize the previous state path metric by subtracting the normalizing factor (norm) from the previous state path metric. In addition, the path metric adder 322 and 324 generate the metrics of the path to the current state from the respective branches in step S323 by adding the branch metrics of the branches, i.e., the branches from the previous state to the current state, to the previous state path metrics. Then, the path metric comparator 325 compares the metrics of paths to the current state for the respective branches, the values generated by the path metric adders 322 and 324, and selects the survival path in step S324. In addition, the path metric selector 325 stores the path metric corresponding to the selected survival path in the path metric storage unit 328. Then, the path metric clipper 327 clips the path metric so that the path metric selected by the path metric selector 325 may not be overflowed, and outputs the clipped path metric.

The trace back unit 330 traces back the trellis of the transmitter convolutional encoder based on the survival path from the ACS operator 320, and generates the expanded decoded data in step S330.

In addition, the central bit sequence selector 400 selects the central bit sequence of the expanded decoded data generated by the trace back unit 330, and outputs the selected central bit sequence in step S400.

The rearrange unit 500 rearranges an order of the central bit sequence, and generates the final decoded data in step S500.

The above described methods and apparatuses are not only realized by the exemplary embodiment of the present invention, but, on the contrary, are intended to be realized by a program for realizing functions corresponding to the configuration of the exemplary embodiment of the present invention or a recoding medium recoding the program.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A Viterbi decoder comprising:
    a receiving buffer for receiving an encoding bit sequence in a convolutional encoding method from a channel;
    a received bit sequence expanding unit for receiving the encoding bit sequence corresponding to an encoding unit from the receiving buffer, and generating an expanded encoding bit sequence by expanding the encoding bit sequence more than twice, wherein some of an initial bit sequence or a last bit sequence of the expanded encoding bit sequence may be omitted;
    a Viterbi decoding unit for receiving the expanded encoding bit sequence, Viterbi decoding the expanded bit sequence, and outputting decoded data;
    a central bit sequence selector for selecting a central bit sequence of the decoded data, and outputting the central bit sequence; and
    a rearrange unit for rearranging an order of the central bit sequence, and generating final decoded data.

2. The Viterbi decoder of claim 1, wherein the Viterbi decoding unit comprises:
    a branch metric calculator for calculating branch metrics of branches by differences between the expanded encoding bit sequence and encoding bits on a trellis of a transmitter convolutional encoder;
    an ACS operator for adding the branch metrics to previous state path metrics, calculating metrics of paths from the respective branches to a current state, and selecting a survival path for a path having a minimum path metric; and
    a trace back unit for tracing back the survival path, and outputting decoded data.

3. The Viterbi decoder of claim 2, wherein the ACS operation comprises:
    a path metric adder for adding the previous state path metrics to branch metrics of branches from the previous state to the current state, and generating the metrics of paths from the respective branches to the current state;
    a path metric comparator for comparing the metrics of paths generated by the path metric adder, and selecting the survival path having the minimum path metric;
    a path metric selector for selecting a path metric corresponding to the survival path and outputting the selected path metric; and
    a path metric storage unit for storing the selected path metric.

4. The Viterbi decoder of claim 2, wherein the branch metric calculator comprises:
    a distance calculator for calculating a distance value between the encoding bit sequence from the received bit sequence expanding unit and representative values of 0 and 1; and
    a branch metric adder for generating the branch metrics generated in a state transition by the distance value calculated by the distance calculator.

5. The Viterbi decoder of claim 4, further comprising a branch metric storage unit for storing the branch metrics generated by the branch metric adder.

6. The Viterbi decoder of claim 3, wherein the ACS operation comprises:
    a normalizing factor generator generating a normalizing factor for preventing the path metric, the path metric accumulated as the trellis proceeds, from being overflowed; and
    a normalizing unit normalizing the previous state path metric by the normalizing factor generated by the normalizing factor generator.

7. The Viterbi decoder of claim 3, further comprising a clipper for clipping the path metric when the path metric selected by the path metric selector is greater than a storing unit of the path metric storage unit.

8. The Viterbi decoder of claim 6, wherein the normalizing factor generator generates the normalizing factor which is the minimum path metric among the previous state path metrics, and the normalizing unit subtracts the normalizing factor from the previous state value.

9. A decoding method comprising:
    a) receiving an encoding bit sequence in a convolutional encoding method from a channel;
    b) generating an expanded encoding bit sequence for an encoding unit based on the encoding bit sequence, wherein the expanded encoding bit sequence is generated by expanding the encoding bit sequence more than twice, and some of an initial bit sequence or a last bit sequence of the expanded encoding bit sequence may be omitted;
    c) Viterbi decoding the expanded encoding bit sequence and outputting decoded data;
    d) selecting a central bit sequence of the decoded data; and
    e) rearranging an order of the central bit sequence and generating final decoded data.

10. The decoding method of claim 9, wherein step c) comprises:
    calculating branch metrics of branches by differences between the expanded encoding bit sequence and encoding bits on a trellis of a transmitter convolutional encoder;
    adding the branch metrics to previous state path metric, calculating metrics of paths to a current state, and selecting a survival path for a branch having a minimum path metric; and
    tracing back the selected survival path, and outputting decoded data.

11. The decoding method of claim 10, wherein the selecting of the survival path comprises:
adding the previous state path metric to branch metrics of branches from the previous state to the current state, and generating the metrics of paths from the respective branches to the current state;
comparing the generated path metrics, and selecting the survival path having the minimum path metric;
selecting a path metric corresponding to the survival path; and
storing the selected path metric.

12. The decoding method of claim 10, wherein the calculating of the branch metric comprises:
calculating a distance value between the encoding bit sequence and representative values of 0 and 1; and
generating the branch metrics generated in a state transition by the distance value.

13. The decoding method of claim 11, wherein the selecting of the survival path further comprises:
generating a normalizing factor which is a minimum path metric among the previous state path metrics; and
subtracting the normalizing factor from the previous state path metric.

14. The decoding method of claim 11, wherein the selecting of the survival path further comprises clipping the selected path metric.

* * * * *